(12) United States Patent
Moess et al.

(10) Patent No.: US 6,825,458 B1
(45) Date of Patent: Nov. 30, 2004

(54) OPTOELECTRONIC RECEIVER AND METHOD OF MAKING AN ALIGNED OPTOELECTRONIC RECEIVER

(75) Inventors: Eberhard Moess, Murrhardt (DE); Bernhard Schwaderer, Weissach (DE)

(73) Assignee: Robert Bosch GmbH, Stuttgart (DE)

( * ) Notice: Subject to any disclaimer, the term of this patent is extended or adjusted under 35 U.S.C. 154(b) by 140 days.

(21) Appl. No.: 09/691,855

(22) Filed: Oct. 17, 2000

(30) Foreign Application Priority Data

Oct. 30, 1999 (DE) .......................................... 199 52 363

(51) Int. Cl.$^7$ ................................................. H01J 5/02
(52) U.S. Cl. ................................................. 250/239
(58) Field of Search ................................ 250/234, 239, 250/208.6, 559.1; 396/77; 348/335, 348

(56) References Cited

U.S. PATENT DOCUMENTS

| | | | |
|---|---|---|---|
| 4,614,974 A | * 9/1986 | Toyama | 348/273 |
| 5,555,334 A | 9/1996 | Ohnishi et al. | 385/93 |
| 5,566,265 A | 10/1996 | Spaeth et al. | 385/93 |
| 5,912,774 A | * 6/1999 | Yoshida et al. | 359/823 |
| 6,133,569 A | * 10/2000 | Shoda et al. | 250/330 |

FOREIGN PATENT DOCUMENTS

| EP | 0 590 393 A | 4/1994 |
|---|---|---|
| EP | 0 831 350 A | 3/1998 |

OTHER PUBLICATIONS

Patent Abstract of Japan, vol. 009, No. 020 (P–330), Jan. 26, 1985 & JP 59 166906 A (Nippon Denshin Denwa kosha), Sep. 29, 1984.
Patent Abstracts of Japan vol. 011, No. 252 (P0605), Aug. 15, 1987 & JP 62 058211 A (Nippon Telegr & Teleph CPR), Mar. 13, 1987.

* cited by examiner

*Primary Examiner*—Thanh X. Luu
*Assistant Examiner*—Stephen Yam
(74) *Attorney, Agent, or Firm*—Michael J. Striker

(57) ABSTRACT

The optoelectronic receiver includes a device (12) for taking in or collecting optical signals, an optical sensor (16) for converting the optical signals into electronic signals; a coupling element (26) for alignment of the optic axis of the device for taking in or collecting the optical signals on a sensitive surface of the optical sensor, a holder (42) for the device (12) for taking in the optical signals; a retaining device (24) for the coupling element (26); and a joint adjusting means (28) for adjusting the holder (42) for the device for taking in the optical signals and the retaining device (24) for the coupling element. After adjustment using the joint adjusting means the holder and retaining device are fixed in position to form an aligned optoelectronic receiver. A method of making the aligned optoelectronic receiver is also described.

1 Claim, 4 Drawing Sheets

OPTOELECTRONIC RECEIVER AND METHOD OF MAKING AN ALIGNED OPTOELECTRONIC RECEIVER

BACKGROUND OF THE INVENTION

1. Field of the Invention

The present invention relates to an aligned optoelectronic receiver and, more particularly, to an optoelectronic receiver comprising a device for taking fin or collecting optical signals, an optical sensor for converting optical signals into electrical signals and a coupling element for aligning an input optical signal on an optical-signal sensitive surface of the optical sensor. It also relates to a method of making an aligned optoelectronic receiver so that it is accurately aligned to receive incoming optical signals.

2. Prior Art

Optoelectronic receivers of the above, described type are known. They have a device for taking in or collecting optical signals (in the following called a telescope), by means of which the optical signals from an external source are guided to an optical sensor for conversion of the optical signals into electrical signals. The optical sensor has a sensitive surface, on which the optical signals must fall in order to be converted into electrical signals. An evaluation electronic circuit is associated with the optical sensor, by means of which the converted electrical signals are evaluated, stored, transmitted or the like.

In order to align the optic axis of the device for taking in optical signals on the sensitive surface of the optical sensor it is known to arrange a coupling element between the device for taking in or collecting optical signals and the optical sensor. An adjustment of the entire optoelectronic receiver is possible by alignment of the coupling element to a predetermined position relative to the optical sensor and of the device for taking in optical signals relative to the coupling element.

In the known optoelectronic receiver a plurality of adjusting devices are required for adjusting the individual elements, which lead to a complicated and thus costly structure and a very extensive work routine in order to perform the individual adjusting steps.

SUMMARY OF THE INVENTION

It is an object of the present invention to provide an improved aligned optoelectronic receiver, in that the adjustments that are necessary to accurately align the optoelectronic receiver to receive incoming optical signals are more easily and simply performed in a more economical process for making the aligned optoelectronic receiver.

It is another object of the invention to provide a method of making an aligned optoelectronic receiver, which is accurately aligned to receive the incoming optical signals.

These objects and others, which will be made more apparent hereinafter, are attained in an optoelectronic receiver comprising a device for taking in or collecting optical signals, an optical sensor for converting the optical signals into electronic signals and a coupling element for alignment of the optic axis of the device for taking in or collecting the optical signals on a sensitive surface of the optical sensor.

According to the invention the optoelectronic receiver includes a holder for the device for taking in the optical signals, a retaining device for the coupling; element and a joint adjusting means for adjusting the holder for the device for taking in the optical signals and the retaining device for the coupling element.

The optoelectronic receiver according to the invention has the advantage provides the advantage that an exact position adjustment of the individual elements of the optoelectronic receiver is possible in a simple manner. Because of the feature that a common adjusting means is provided for both a holder of the device for taking in or collecting the optical signals and a retaining device for the coupling element, the adjustment of the entire optoelectronic receiver is essentially simplified. The common adjusting means may be used in an especially simple way for subsequent adjustments of the coupling element relative to the optical axis of the optoelectronic receiver and the device for taking in optical signals relative to the coupling element.

In a preferred embodiment of the invention the common adjusting means is an optical bench, which has a predetermined upper surface. This upper surface is used for alignment of the coupling element and the device for collecting or taking in the optical signals. In a particularly simple manner an exact adjustment is possible in a particularly simple manner by a common reference surface for the coupling element and the retaining device. Alignment errors for; the reference surface lead to equal deviations of the adjustment of the coupling element and the device for receiving the optical signals. An exact alignment of the optical signals on the sensitive surface of the optical sensor and thus with the optic axis of the entire optoelectronic receiver is thus possible.

Especially self-adjustment of the optoelectronic receiver by an external optical test signal by means of the common adjusting means is preferable. Both the coupling element and also the device for collecting or taking in the optical signals can be changed in their position relative to each other by the common adjusting device, so that an electrical signal is generated by the optical sensor, which provides a result used for the adjustment of the optoelectronic receiver, with the known optical test signal. This procedure provides a highly precisely adjusted optoelectronic receiver.

BRIEF DESCRIPTION OF THE DRAWING

The objects, features and advantages the invention will now be illustrated in more detail with the aid of the following description of the preferred embodiments, with reference to the accompanying figures in which.

DESCRIPTION OF THE PREFERRED EMBODIMENTS

Figure 1:
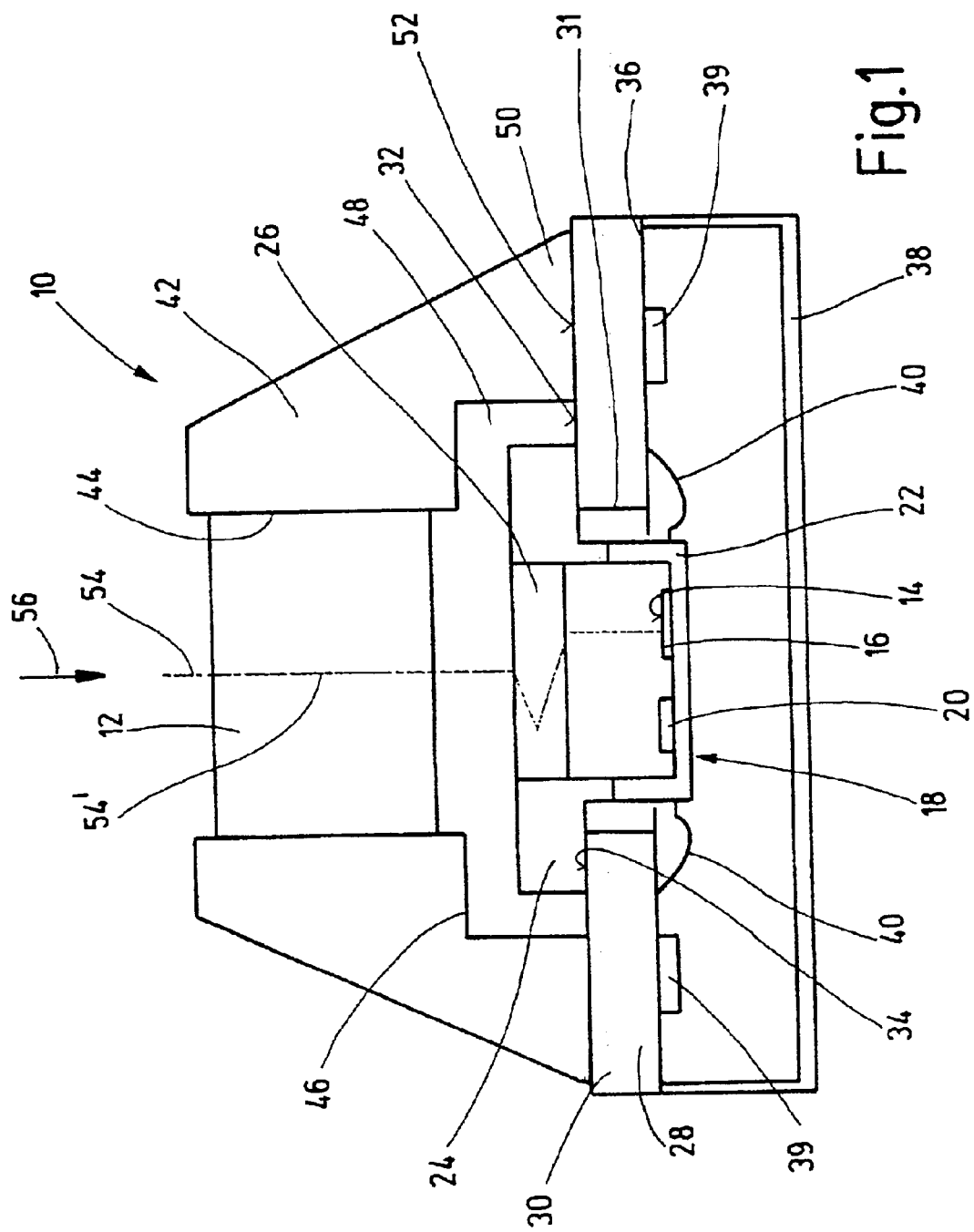
FIG. 1 is a schematic cross-sectional view through an optoelectronic receiver according to the invention.

FIG. 1 is a longitudinal cross-sectional view through an optoelectronic receiver 10. The optoelectronic receiver 10 comprises a device 12 for taking in optical signals (also referred to as a telescope in the following). Optical signals are conducted to a sensitive surface of an optical sensor 16 by means of the telescope 12. The optical sensor 16 is part of a module 18, which includes evaluation electronics 20. The optical sensor 16 and the evaluation electronics 20 are arranged in a housing 22, which at the same time acts as a retaining device 24 for the module 18. An optical coupling element 26 is integrated in a side of the housing 22 closest to the telescope 12. The position of the optical coupling element 26 relative to the sensor 16 is determined by the structure and construction of the housing 22. The optical coupling element 26 comprises an unshown detailed structure, which guides optical signals falling on it so that they fall on the sensitive surface 14 of the optical sensor or sensor element 16.

The housing 22 is mounted with its retaining device 24 on an adjusting means 28, which is formed by an optical bench 30. The optical bench 30 has a defined surface 32, on which the retaining device 24 sits with a guiding surface 34. The optical bench 30 forms a cover or roof 36 of another housing 38, inside of which additional circuit components 39 of the optoelectronic receiver 10 are housed. These additional circuit components 39, for example, are structured on an under side of the optical bench 30. An electrical connection between the module 18 and the circuit components 39 occurs by means of an electrical connection indicated here, for example, by bonding wire, band or ribbon connector or the like. The housing 22 shown in FIG. 1 has unshown through-going contacts (vias) for contacting the evaluation electronics 20. The optical bench 30 has a passage 31 for receiving the module 18.

The optoelectronic receiver 10 further comprises a holder 42 for the telescope 12. The holder 42 comprises a receptacle 44 for the telescope 12, which is converted or goes over into a receiving chamber 48 for the module 18 by means of a step 46. The holder 42 quasi-embraces or partially surrounds the retaining device 24 of the module 18 with its feet 50. The feet 50 of the holder 42 have guiding surfaces 52, which rest on the upper surface 32 of the optical bench 30.

The upper surface of the optical bench 30 and the guiding surfaces 34 of the retaining device 24 and the guiding surfaces 52 of the holder 42 are flat so that the module 18 and the telescope 12 are aligned relative to an optic axis 54 of the optoelectronic receiver 10 by means of the upper surface 32 of the optical bench 30. The mounting angle of the module 18 and the telescope 12, which ideally amounts for 90° to the optic axis 54, is thus set or fixed by means of the optical bench 30. However this angle may be varied from 90° with upper surface 32, guiding surfaces 52 and 34 oriented at the same angle. Furthermore the optic axis 54' of the telescope 12 may be aligned with the optic axis of the coupling element 26 and thus on the sensitive surface 14 of the optic sensor 16, in an easy way by means of the common adjusting means 28 for the module 16' and the telescope 12. This only requires a shift of the holder 42 for the telescope 12 relative to the retaining device 24 of the module 18.

The adjustment of the optoelectronic receiver 10 takes place according to the following procedure. The operation of the optoelectornic receiver is generally known so that it need not be illustrated here in detail in the description of the, invention here. It should be clear from the figures that an optical signal 56 from an unshown external source is received and converted into an electrical signal. For that purpose the optic axis 54' of the telescope 12 is aligned so that the optical signal 56 falls on the sensitive surface 14 of the optic sensor 16.

First the module 18 is set in the passage 31 of the optical bench 30, so that the guiding surface 34 is positioned on the upper surface 32. After positioning of the module 18 attachment occurs, for example by means of laser welding, adhesives or the like, so the warping or distortion is minimal. Subsequently the holder 42 is mounted with the telescope 12 on the optical bench 30. An exact relative displacement of the holder 42 and thus the telescope on the module 18 can occur because of the planar guiding surface 52 and the planar upper surface 32, without the optic axis 54' of the telescope experiencing an angular shift relative to the optic axis 54 of the optoelectronic receiver 10. The optic axis 54' of the telescope 12 has a definite angular orientation relative to the optic axis 54, which is determined by the planar surfaces 32, 52 and 34.

For adjustment purposes the optoelectronic receiver 10 can be acted on with a definite optical test (adjusting) signal 56. This optical test signal is guided through the telescope 12 to the coupling element 26. The positioning of the telescope 12 can occur by sliding the holder 42 relative to the optical bench 30 and thus the retaining device 24 until an expected electrical signal is produced in response to the test optical signal by means of the evaluation electronics 20 and 39. When this is the situation, the telescope is adjusted in such a way that the optic axis 54' of the telescope 12 coincides with the optic axis 54 of the optoelectronic receiver 10, so that the optical signals reach the optical-signal sensitive surface 14 of the optic sensor 16. The adjustment may be performed by simple steps, with the aid of a clear sign. Especially a quasi-self-adjustment is possible by means of a received optical test signal 56, which decisively effects the accuracy and control of the adjustment of the optoelectronic receiver 10 and guarantees a higher accuracy. After reaching the adjusted position of the holder 42 it can be fixed with minimal distortion or warping, for example by means of laser welding or gluing, to the optical bench 30.

Figure 2:
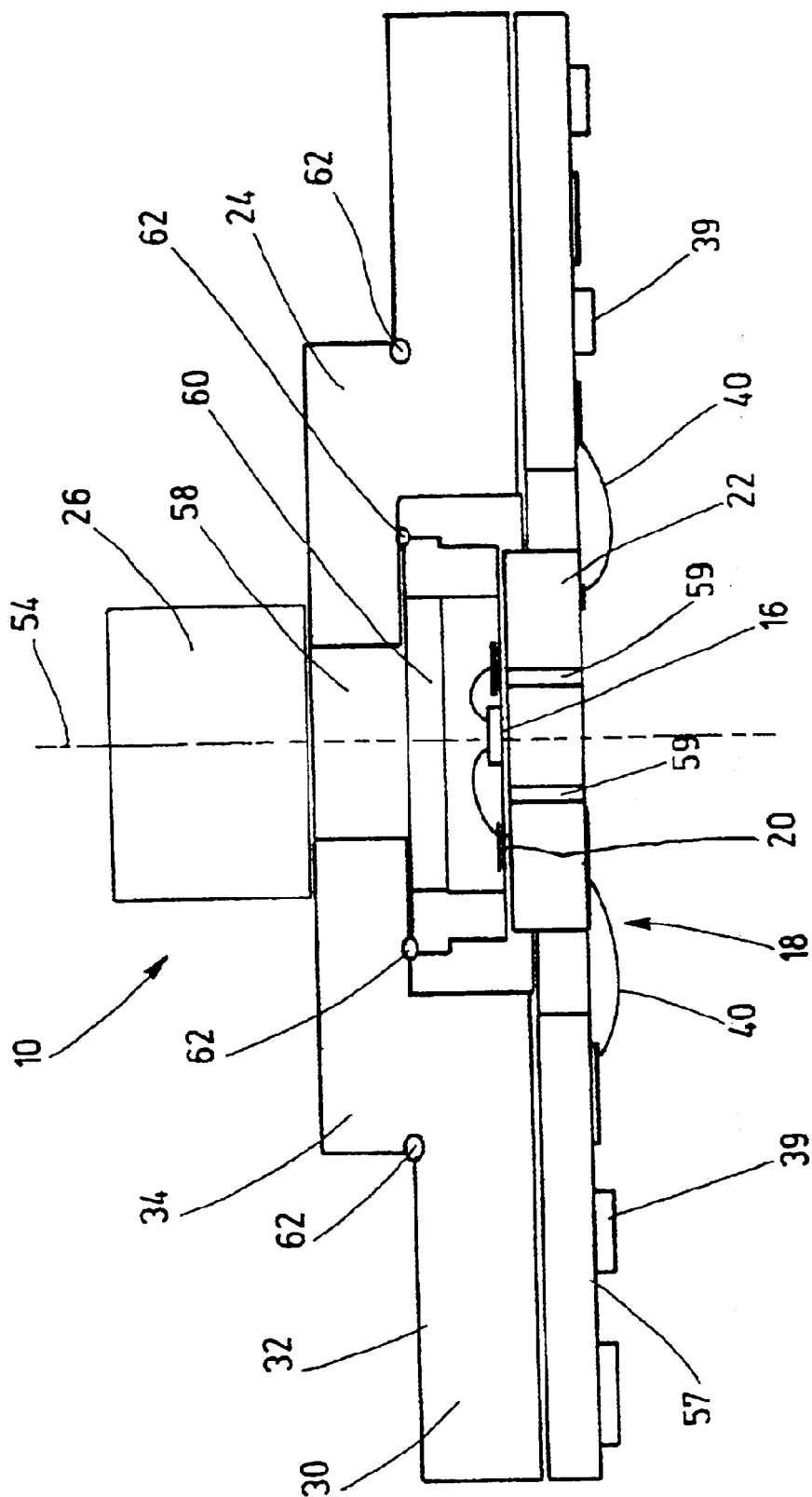
FIGS. 2 to 4 are respective detailed views of the optoelectronic receiver according to the invention.

FIG. 2 shows the essential features of the optoelectronic receiver 10. The same parts as shown in FIG. 1 are provided with the same reference symbols and are not described in further detail in relation to FIG. 2. The optical bench 30 has a circuit board 57 on its underside, on and in which the electronic circuit components 39 are integrated. Through-going contacts 59 are provided in the housing 22, by which an electrical contacting of the connecting conductors 40 occurs, on the one hand, and of the evaluation electronics 20, on the other hand. The housing 22, for example, is a ceramic housing. The retaining device 24 carries the coupling element 26 over a passage 58. The retaining device 24 is provided with an optical window 60 on the side closest to the optical sensor 116, so that a hermetic seal of the optic sensor 1(3 in the housing 22 results. Joining points 62, on which a force-locking connection of the retaining device 24 and the housing 22, on the one hand, and the retaining device 24 and the optical bench, on the other hand, can occur. This force-locking connection can, for example, occur by laser welding or gluing processes. Adjustment accuracy of about 0.1 $\mu$m with a warping or distortion of <1 $\mu$m is obtained.

Figure 3:
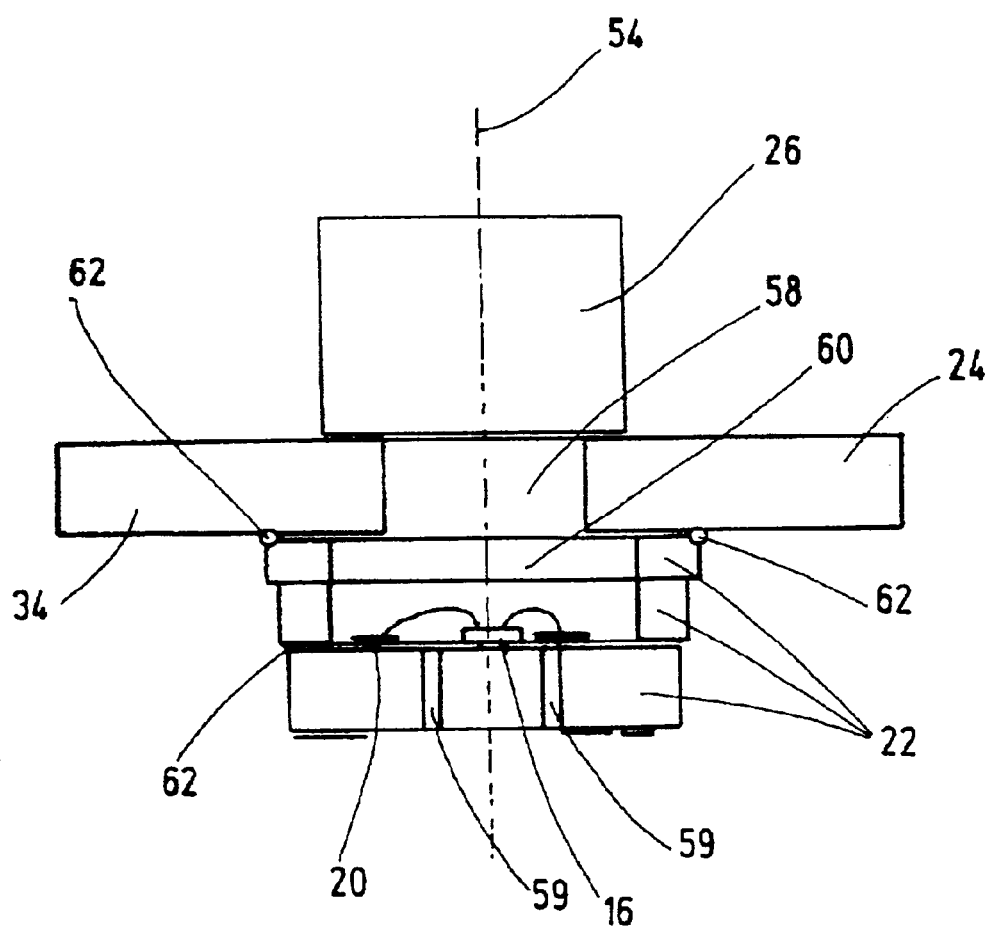

FIG. 3 shows the module 18 of the optoelectronic device 10 alone. The connection of the retaining device 24 with the housing 22 is made at the connection points 62 is shown in FIG. 3.

Figure 4:
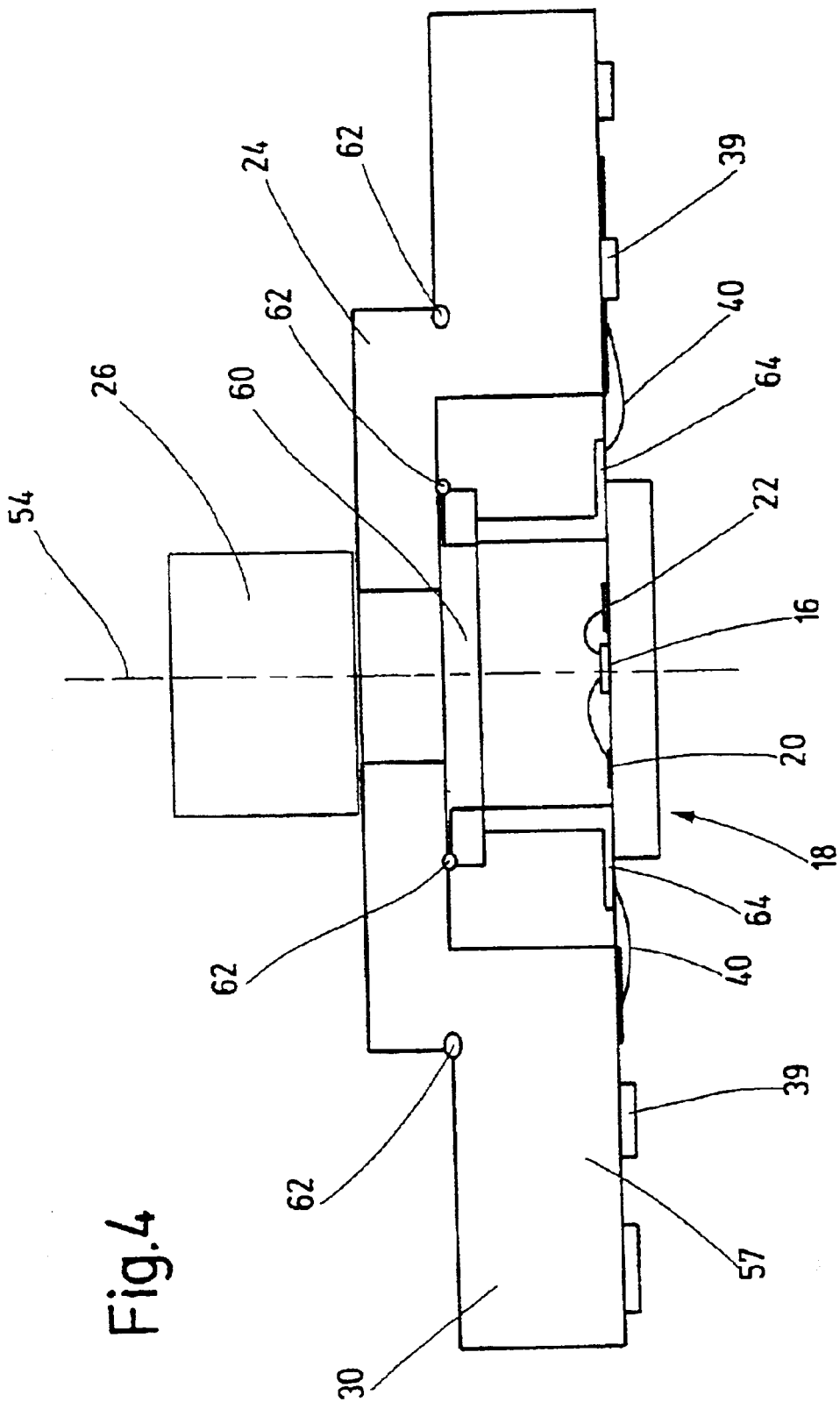

FIG. 4 shows finally another embodiment, in which the method of contacting of the evaluation electronics 20 with the circuit components 39 is different. According to the previous figures the through-going contacts 59 were provided in the housing 22. In the embodiments shown in FIG. 4 a so-called frame connector 64 (lead frame) is provided, by which it is possible to contact the evaluation electronics with the additional circuit components 39. This contacting frame 64 may integrate certain structural elements by means of known manufacturing processes.

The disclosure in German Patent Application 199 52 363.0 of Oct. 30, 1999 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in an optoelectronic receiver, it is not intended to be limited to the details shown, since various modifications and changes may be made without departing in any way from the spirit of the present invention.

Without further analysis, the foregoing will so fully reveal the gist of the: present invention that others can, by applying current knowledge, readily adapt it for various applications without omitting features that, from the standpoint of prior art, fairly constitute essential characteristics if the generic or specific aspects of this invention.

We claim:

1. A method of making an aligned optoelectronic receiver (10), said optoelectronic receiver (10) having an optic axis (54) and comprising a device (12) for taking in optical signals having an optic axis (54'); an optical sensor (16) for converting the optical signals into electronic signals when the optical signals fall on a sensitive surface (14) of said optical sensor (16); a coupling element (26) for alignment of the optic axis (54') of the device (12) for taking in the optical signals on the sensitive surface (14) of the optical sensor (16); a holder (42) for the device (12) for taking in the optical signals; a retaining device (24) for the coupling element (26); and a joint adjusting means (28) for adjusting the holder (42) for the device for taking in the optical signals and the retaining device (24) for the coupling element, wherein said adjusting means (28) comprises an optical bench (30), said optical bench (30) is provided with a predetermined upper surface (32) and the upper surface (32) of the optical bench (30) comprises means for aligning the coupling element (26) and the device (12) for taking in the optical signals, wherein said retaining device (24) and said holder (42) have respective guiding surfaces (34, 52) bearing on said upper surface (32) of said optical bench (30); said method comprising the steps of:

a) providing a module (18) including the optical sensor (16), a housing (22) for the optical sensor, the coupling element (26) and the retaining device (24) for the coupling element and providing a passage (31) in the optical bench (30) for accommodating the module (18);

b) placing the module (18) in the passage (31) in the optical bench (30);

c) attaching the module (18) to the optical bench by laser welding or gluing;

d) placing the holder (42) with the device (12) for taking in optical signals on the optical bench (30);

e) inputting a test optical signal through the device (12) for taking in the optical signals;

f) displacing the holder (42) relative to the optical bench (30) until a predetermined electrical signal is produced by the optical sensor (16) in response to the test optical signal by means of evaluation electronics (20), said electrical signal indicating attainment of an aligned configuration; and g) after the inputting of step e) and the displacing of the holder step f), attaching the holder (42) to the optical bench (30) at attachment points (62) by means of laser welding or glueing, whereby said aligned optical receiver is formed.

* * * * *